US012588167B2

(12) United States Patent
Yang et al.

(10) Patent No.: US 12,588,167 B2
(45) Date of Patent: Mar. 24, 2026

(54) AIR CONDITIONER USING WATER VAPOR REFRIGERANT FOR MODULAR DATA CENTER AND DATA CENTER COMPRISING SAME

(71) Applicant: BEIJING JINGKELUN ENGINEERING DESIGN AND RESEARCH INSTITUTE CO., LTD., Beijing (CN)

(72) Inventors: Jianguo Yang, Beijing (CN); Xiaolong Li, Beijing (CN); Weibo Xie, Beijing (CN); Jilong Zhang, Beijing (CN); Quanjiang Wang, Beijing (CN); Ximou Chen, Beijing (CN); Chengjun Zhou, Beijing (CN); Jianhui Kang, Beijing (CN)

(73) Assignee: BEIJING JINGKELUN ENGINEERING DESIGN AND RESEARCH INSTITUTE CO., LTD., Beijing (CN)

( * ) Notice: Subject to any disclaimer, the term of this patent is extended or adjusted under 35 U.S.C. 154(b) by 79 days.

(21) Appl. No.: 18/702,729

(22) PCT Filed: Oct. 28, 2022

(86) PCT No.: PCT/CN2022/128153
§ 371 (c)(1),
(2) Date: Apr. 18, 2024

(87) PCT Pub. No.: WO2023/226299
PCT Pub. Date: Nov. 30, 2023

(65) Prior Publication Data
US 2025/0248007 A1    Jul. 31, 2025

(30) Foreign Application Priority Data
May 27, 2022    (CN) .......................... 202210586820.8

(51) Int. Cl.
*H05K 7/20*        (2006.01)

(52) U.S. Cl.
CPC ................................ *H05K 7/20827* (2013.01)

(58) Field of Classification Search
CPC .... H05K 7/20827; H05K 7/20745; F24F 6/14
See application file for complete search history.

(56) References Cited

U.S. PATENT DOCUMENTS 8,974,274 B2 *    3/2015    Carlson .............. H05K 7/20836
                                                              62/259.4
9,278,303 B1 *    3/2016    Somani ..................... F24F 6/14
                            (Continued)

FOREIGN PATENT DOCUMENTS

CN            2110821 U        7/1992
CN            2438044 Y        7/2001
                    (Continued)

OTHER PUBLICATIONS

Japan Patent Office, Office Action in JP Patent Application No. 2024-515358, dated Jan. 21, 2025, 9 pages with English translation.
(Continued)

*Primary Examiner* — Lionel Nouketcha
(74) *Attorney, Agent, or Firm* — Schwabe, Williamson & Wyatt, P.C.

(57)        ABSTRACT

An air conditioner using a water vapor refrigerant for a modular data center in the present invention comprises a box body and an air conditioning system. The air conditioning system includes a heat exchanger, a water atomization device, an air circulation side fan and a vapor side fan. The heat exchanger is provided with multiple columns of bidi-rectional micro-channels on both sides; the water atomiza-tion apparatuses cooperate with pressure regulation appara-tuses to form vapor; the vapor side fan is used for forming a negative pressure, such that the vapor evaporates under the
(Continued)

negative pressure in a C-D direction and absorbs heat in the heat exchangers so as to achieve refrigeration; and the air circulation side fan is used for sucking, into the micro-channels of the heat exchanger and in an A-B direction, air in a space needing to be cooled.

12 Claims, 7 Drawing Sheets

(56) References Cited

U.S. PATENT DOCUMENTS

| | | | |
|---|---|---|---|
| 2013/0081784 A1 | 4/2013 | Faig Palomer | |
| 2016/0192542 A1* | 6/2016 | LeFebvre | H05K 7/20836 |
| | | | 29/401.1 |
| 2016/0356517 A1 | 12/2016 | Kim | |
| 2023/0366594 A1 | 11/2023 | Yang | |

FOREIGN PATENT DOCUMENTS

| | | | | |
|---|---|---|---|---|
| CN | 101871681 | A | 10/2010 | |
| CN | 201819327 | U | 5/2011 | |
| CN | 110425652 | A * | 11/2019 | ............... F24F 3/14 |
| CN | 110769646 | A | 2/2020 | |
| CN | 212319896 | U | 1/2021 | |
| CN | 213818605 | U | 7/2021 | |
| CN | 215864149 | U | 2/2022 | |
| CN | 114251879 | A | 3/2022 | |
| CN | 217635973 | U | 10/2022 | |
| JP | H08141102 | A | 6/1996 | |
| JP | 2000125829 | A | 5/2000 | |
| JP | 2004317064 | A | 11/2004 | |
| JP | 2013524329 | A | 6/2013 | |
| JP | 2016223767 | A | 12/2016 | |

OTHER PUBLICATIONS

International Search Report & Written Opinion for PCT/CN2022/128153, dated Dec. 16, 2022, 9 pages, including English translation.
China National Intellectual Property Administration, First Office Action in CN Application No. 202210586820.8, dated May 30, 2025, 14 pages with English translation.
Japan Patent Office, Notice of Reasons for Refusal in JP Patent Application No. 2024-515358, dated Jun. 24, 2025, 9 pages with English translation.

* cited by examiner

AIR CONDITIONER USING WATER VAPOR REFRIGERANT FOR MODULAR DATA CENTER AND DATA CENTER COMPRISING SAME

CROSS-REFERENCE TO RELATED APPLICATION

The present application is a national phase entry under 35 U.S.C. § 371 of International Application No. PCT/CN2022/128153, filed Oct. 28, 2022, entitled "AIR CONDITIONER USING WATER VAPOR REFRIGERANT FOR MODULAR DATA CENTER AND DATA CENTER COMPRISING SAME," which designates the United States of America, which claims priority to CN application No. 202210586820.8, filed May 27, 2022, the entire disclosures of each of these applications are hereby incorporated by reference in their entireties and for all purposes.

FIELD

The present application relates to the technical field of air conditioners for a data center, and in particular to an air conditioning using a water vapor refrigerant for a modular data center and a data center including the same.

BACKGROUND

A data center refers to a computer room where a server is placed in the technical field of communication and information. With the rapid development of modern computer and internet technology, the data center plays an important role in all walks of life. The data center has a complex internal structure, and an information system composed of servers and network devices completes a calculation task and generates heat energy by consuming electric energy. The heat dissipation and cooling of the servers and other devices in the computer room consumes a lot of electric energy. The problem of energy consumption has given rise to the concept of green data center. The problem of high energy consumption has become the bottleneck of the green and sustainable development of data centers. The energy consumption of an air conditioning system accounts for a large part of the total energy consumption of the data center, and reducing the energy consumption of the air conditioning system has become a key energy-saving link to improve the electric energy utilization efficiency of the data center.

At present, a vapor compression refrigeration mode is generally used by the air conditioning system used in the data center, which circulates a refrigerant by a compressor. A refrigeration device mainly includes a compressor, a condenser, a throttling device, an evaporator, etc., During refrigeration, the compressor extracts the refrigerant from the evaporator, compresses the refrigerant, and sends the refrigerant to the condenser for cooling and condensation. The emitted heat is discharged into the air by the condenser, and the refrigerant also changes from a gaseous state to a liquid state. After the refrigerant is throttled by the throttling device in the condenser, the pressure drops suddenly. After flowing through the evaporator, the liquid refrigerant immediately becomes gaseous, and a large amount of heat in the air is absorbed by the evaporator. In this way, when the compressor keeps working, it constantly absorbs the heat into the refrigerant from one end of the evaporator and then sends the refrigerant to the condenser so as to dissipate the heat into the air. At this time, the refrigerant absorbs heat indoors and releases heat outdoors, thus the indoor temperature is decreased by the circulation. Refrigeration in this way has the disadvantage of high energy consumption.

Therefore, it is the innovation motivation for the present application to provide an air conditioner using a water vapor refrigerant for a modular data center and a data center including the same with a simple structure, low energy consumption, low cost and a high refrigeration efficiency.

SUMMARY

An object according to the present application is to overcome the disadvantages of the conventional technology, and provide an air conditioner using a water vapor refrigerant for a modular data center with a simple structure, low energy consumption, low cost and a high refrigeration efficiency. Another object according to the present application is to provide a data center based on the air conditioner using the water vapor refrigerant, which occupies a small area, is easy to deploy, can eliminate the interference of external temperature and humidity, and operates safely and reliably.

A technical solution of an air conditioner using a water vapor refrigerant for a modular data center according to the present application is as follows.

An air conditioner using a water vapor refrigerant for a modular data center includes a box body and an air conditioning system, where the air conditioning system includes a heat exchanger, a water atomization device, an air circulation side fan and a vapor mist side fan, each heat exchanger has multiple columns of double-sided bidirectional micro-channels along an A-B direction and along a C-D direction, the vapor mist side fan is arranged outside the box body, each water atomization device is arranged on one side of the corresponding heat exchanger, each water atomization device includes a pressure regulating device which cooperates with the water atomization device to form vapor mist, the vapor mist side fan is configured to form a negative pressure, so that the vapor mist evaporates under the negative pressure in the heat exchanger along the C-D direction to absorb heat and refrigerate; the air circulation side fan is configured to suck air in a space to be cooled into the micro-channels of the heat exchangers, and the air is discharged into the spaced to be cooled after heat exchange is completed in the micro-channels.

Specifically, the heat exchangers are surface-type heat exchangers or shell-and-tube heat exchangers.

Specifically, a pressure in a cavity of the water atomization device is smaller than an ambient atmospheric pressure by 20 Pa or more.

Specifically, the pressure regulating device is an electric air valve and a negative pressure sensor.

Specifically, the water atomization device is a high-pressure pump atomizer;

or the water atomization device is an air compression atomizer;

or the atomization head is an ultrasonic atomizer.

Specifically, a water softening device is mounted on a pipeline for supplying water to the water atomization device.

A modular container-type data center includes modular containers and air conditioners, where a space for placing a server is defined in each modular container, and the modular containers are connected through air ducts, where the air conditioner is the air conditioner using the water vapor refrigerant for the modular data center according to any one of the above.

Specifically, the air conditioner includes a first heat exchanger and a second heat exchanger, the first heat exchanger and the second heat exchanger are fixed to the top of the modular container through a first water atomization device and a second water atomization device, the vapor mist side fan arranged outside the box body sucks out the vapor mist through the air ducts, and the air circulation side fan arranged at the bottom of the heat exchangers sucks the air in the modular container into the micro-channels of the heat exchangers for heat exchange.

Specifically, the data center includes n modular containers, the water atomization devices in the n modular containers are supplied with water through water supply pipelines, and another side of each water atomization device is connected with the vapor mist side fan outside the box body through the air duct.

An insulation board is provided on each surface of the data center.

Specifically, the data center includes a liquid-jet carbon dioxide gas fire-fighting system, where the liquid-jet carbon dioxide gas fire-fighting system comprises a liquid reservoir for storing liquid carbon dioxide and a liquid carbon dioxide fire-fighting pipeline, and the liquid carbon dioxide fire-fighting pipeline is connected to each modular container;

a three-way pipe is arranged at an air outlet port of the top fan for waste heat recovery.

The implementation of the present application includes the following technical effects.

In the air conditioner using the water vapor refrigerant for the modular data center according to the present application, the water vapor refrigerant is a mixed vapor formed by water and air under a micro negative pressure. On the negative pressure vapor mist side, small atomized water droplets generated by the water atomization device form the vapor mist under the cooperation of the vapor mist side fan and the pressure regulating device. In the process of passing through the micro-channels of the heat exchangers, the vapor mist evaporates and refrigerates without boiling under the micro negative pressure with the pressure smaller than the ambient atmospheric pressure by 20 Pa or more. Specifically, each small water droplet continuously absorbs heat through radiation or conduction, and the water molecules on a surface of the small water droplet easily escape from an internal force of the small water droplet under the dual action of the negative pressure and radiation, and evaporates and absorbs heat under the negative pressure, or the atomized large water droplet further disperses into small water droplets to absorb heat, thereby cooling the hot air. On the air circulation side, the air circulation side fan sucks the air in the space to be cooled into the air-side micro-channels of the heat exchangers, completes heat exchange in the air-side micro-channels, and discharges the air to the space to be cooled from another side of the micro-channels to realize cooling.

The air conditioner using the water vapor refrigerant according to the present application has simple structure, low energy consumption, low cost and high refrigeration efficiency, and can prevent outdoor temperature and humidity from affecting indoor environment. Water is used as the refrigerant according to the present application, and the water is atomized and mixed with air to form the vapor mist, which can be evaporated and refrigerated under the micro negative pressure. The refrigeration device does not require a compressor to drive the refrigerant to circulate (vapor compression cycle refrigeration), and a PUE (Power Usage Effectiveness) value of the data center is as low as 1.05. Therefore, the complexity of the device is greatly reduced, and the manufacturing cost and operating cost are reduced.

4

Figure 1:
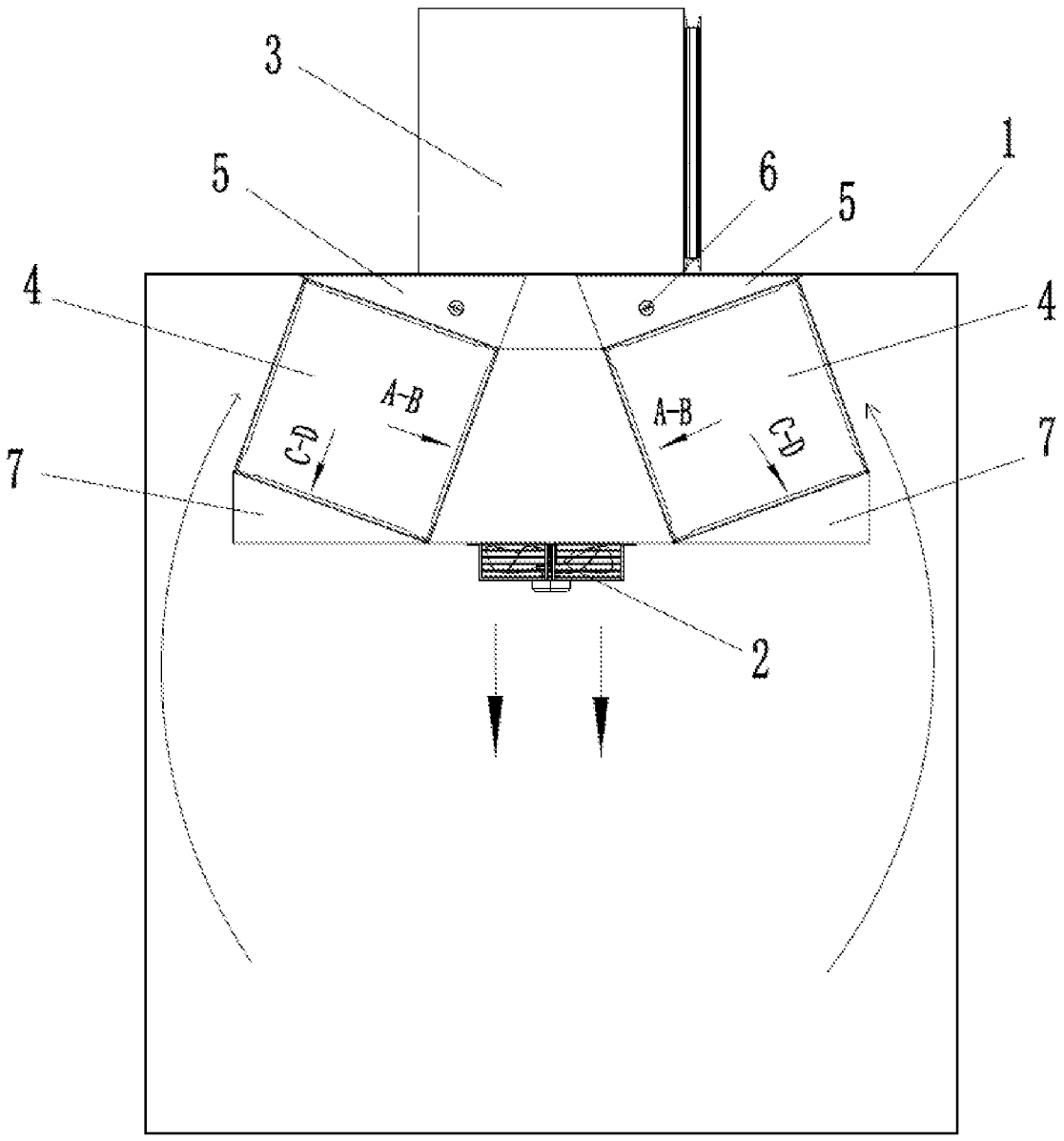
FIG. 1 is a schematic front view of an air conditioner using a water vapor refrigerant for a modular data center according to an embodiment of the present application.
Figure 2:
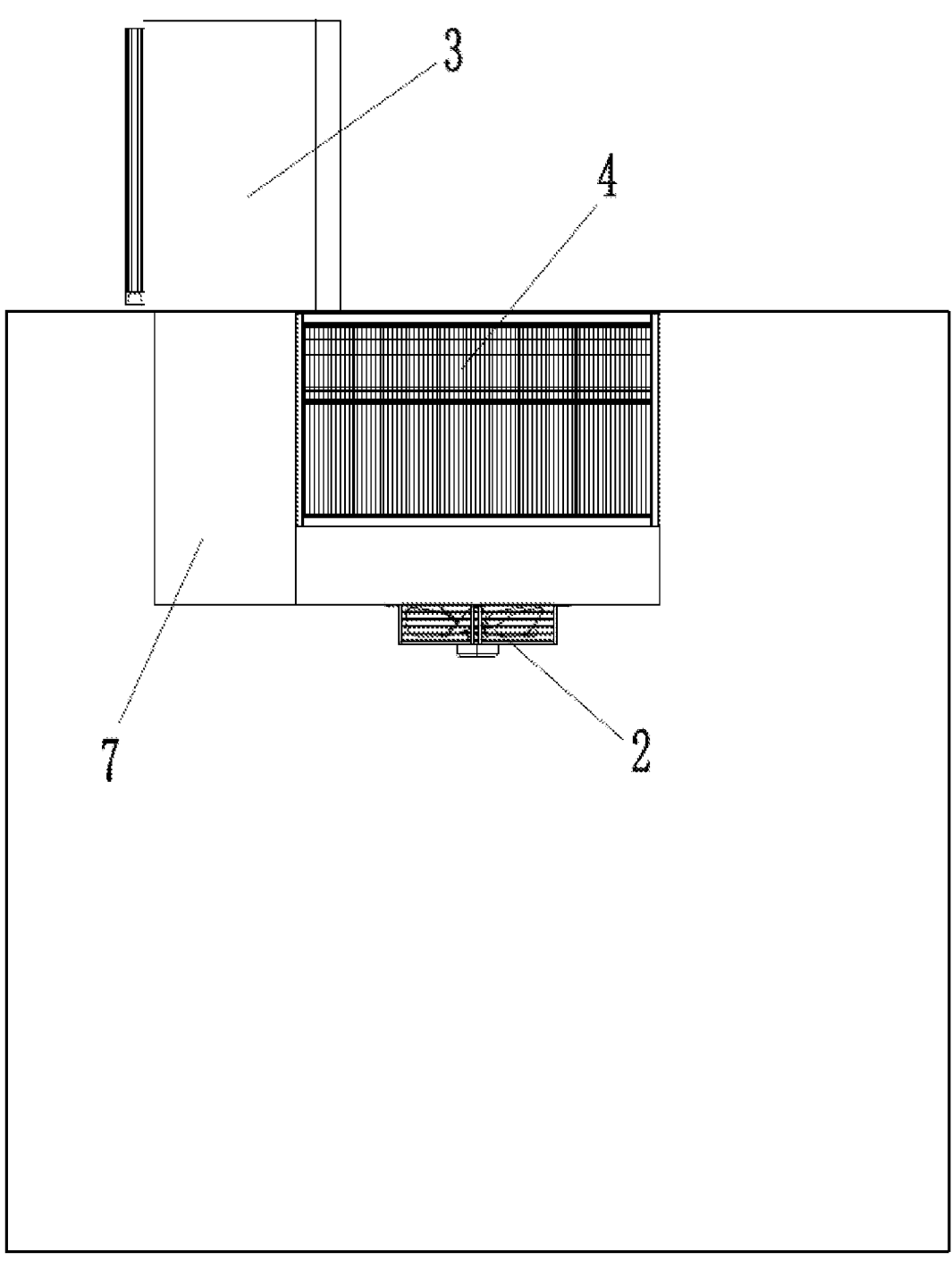
FIG. 2 is a schematic side view of the air conditioner using the water vapor refrigerant for the modular data center according to the embodiment of the present application.
Figure 3:
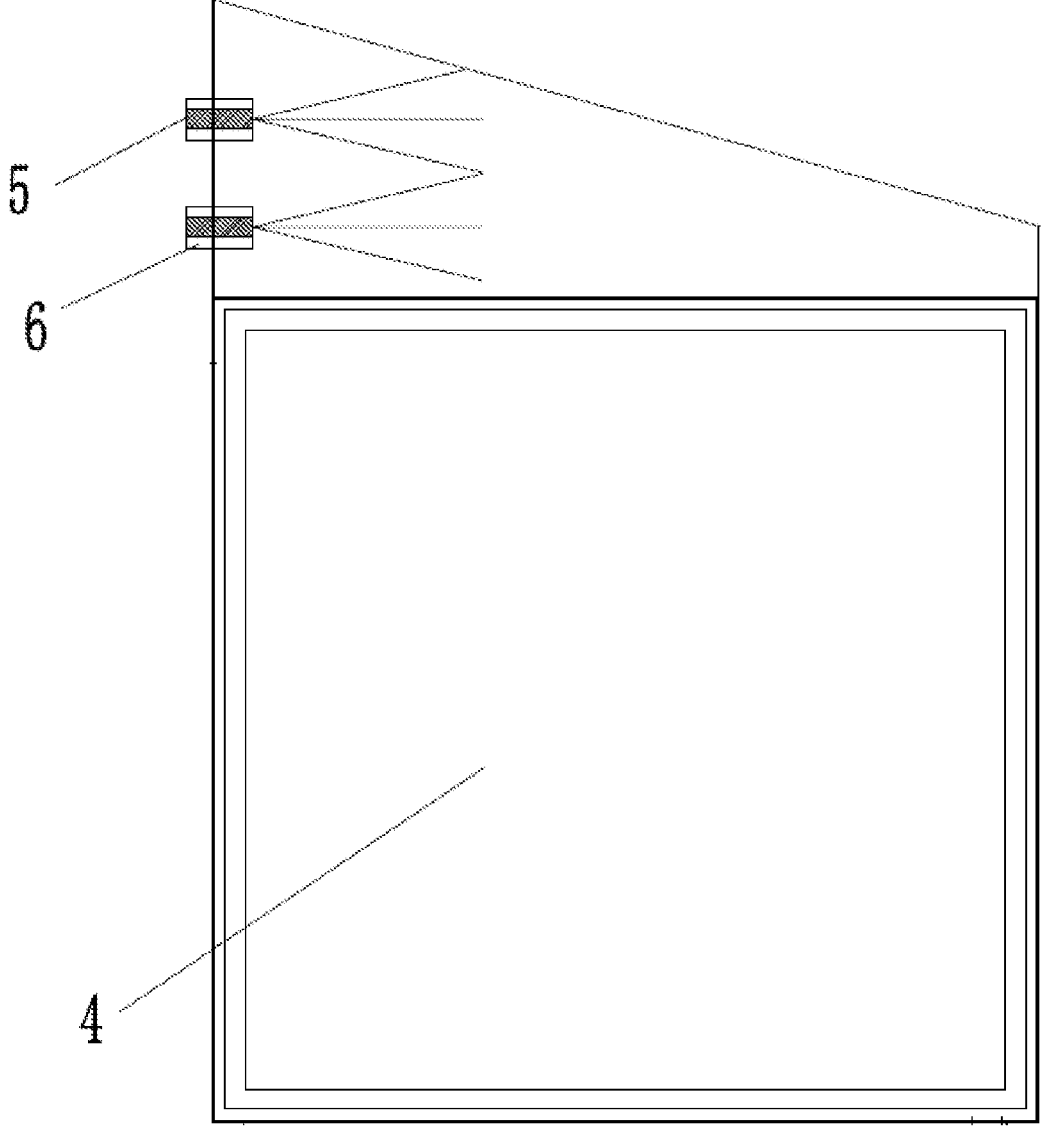
FIG. 3 is a schematic view showing a connection between a heat exchanger and a water atomization device.
Figure 4:
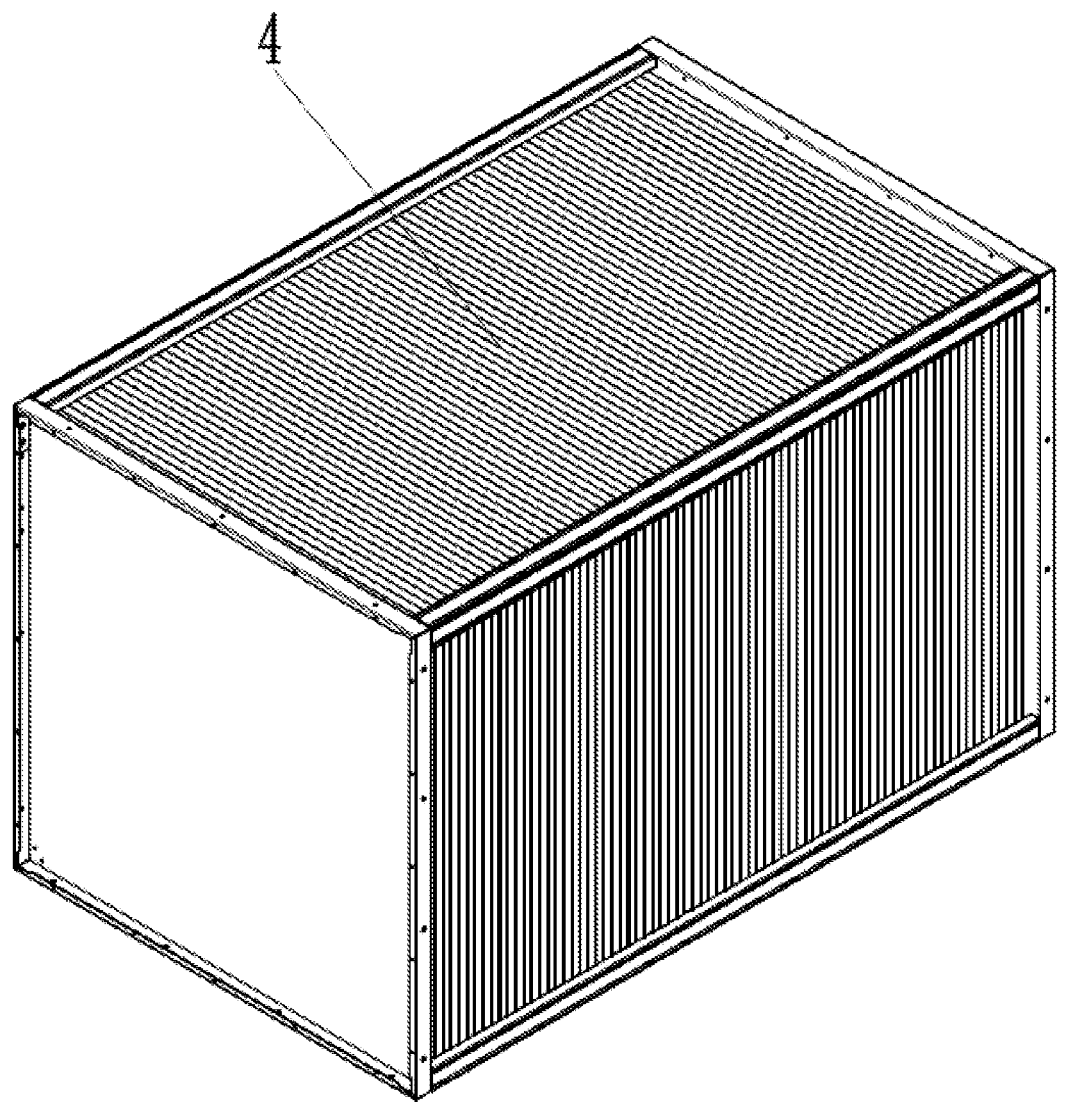
FIG. 4 is a schematic structural view of the heat exchanger.

Reference numerals in the drawings are listed as follows:

| | |
|---|---|
| 1, box body; | 2, air circulation side fan; |
| 3, vapor mist side fan; | 4, water atomization device; |
| 6, pressure regulating device; | 7, air duct. |

DETAILED DESCRIPTION OF EMBODIMENTS

The present application is described in detail below with reference to the embodiments and the drawings. It should be noted that the described embodiments are only intended to facilitate the understanding of the present application and do not limit the present application.

Referring to FIG. 1, an air conditioner using a water vapor refrigerant for a modular data center in this embodiment includes a box body 1 and an air conditioning system. The air conditioning system includes a heat exchanger 4, a water atomization device 5, an air circulation side fan 2 and a vapor mist side fan 3. The heat exchanger 4 has multiple columns of double-sided bidirectional micro-channels along an A-B direction and along a C-D direction. The vapor mist side fan 3 is arranged outside the box body 1. The water atomization device 5 is arranged on one side of the heat exchanger 4. The water atomization device 5 includes a pressure regulating device 6 which cooperates with the water atomization device 5 to form vapor mist, and the vapor mist side fan 3 is configured to form a negative pressure, so that the vapor mist evaporates under the negative pressure in the heat exchanger 4 along the C-D direction to absorb heat and refrigerate. The air circulation side fan 2 is configured to suck air in a space to be cooled into the micro-channels of the heat exchanger 4, and the air is discharged into the space to be cooled after heat exchange is completed in the micro-channels. The C-D direction and the A-B direction in this embodiment are distributed on different side surfaces, with multiple columns of micro-channels on each side. The C-D direction and the A-B direction are only for the convenience of describing the technical solution, and the direction of the vapor mist and air may be straight, diagonal, or curved. In the air conditioner using the water vapor refrigerant for the modular data center according to the present application, the water vapor refrigerant is a mixed vapor formed by water and air under a micro negative pressure. On the negative pressure vapor mist side, small atomized water droplets generated by the water atomization device 5 form the vapor mist under the cooperation of the vapor mist side fan 3 and the pressure regulating device 6. In the process of passing through the micro-channels of the heat exchanger 4, the vapor mist evaporates and refrigerates without boiling under the micro negative pressure with the pressure smaller than the ambient atmospheric pressure by 20 Pa or more. Specifically, each small water droplet continuously absorbs heat through radiation or conduction, and the water molecules on a surface of the small water droplet may easily escape from an internal force of the small water droplet under the dual action of the negative pressure and radiation, and evaporate and absorb heat under the negative pressure, or the atomized large water droplet further splits into small water droplets to absorb heat, thereby cooling the hot air. On the air circulation side, the air circulation side fan 2 sucks the air in the space to be cooled into the air-side micro-channels of the heat exchanger 4, completes heat exchange in the air-side micro-channels, and discharges the air to the space to be cooled from another side of the micro-channels to realize cooling.

Specifically, the heat exchanger 4 is a surface-type heat exchanger or a shell-and-tube heat exchanger. The heat exchanger 4 has horizontal and vertical micro-channels, which are separated by fins, and only exchange energy with each other, without exchanging substances such as mist, so that outdoor temperature and humidity can be prevented from affecting the indoor environment. A pressure in a cavity of the water atomization device 5 is smaller than an ambient atmospheric pressure by 20 Pa or more. The pressure regulating device 6 includes an electric air valve and a negative pressure sensor, and forms a set negative pressure cooperating with the vapor mist side fan 3. During the operation of the air conditioning system, a small amount of outdoor air can enter the cavity of the water atomization device 5 through the electric air valve, so that the atomized water in the cavity forms the vapor mist and flow is accelerated, which promotes the evaporation of the atomized water and large atomized water droplets further splitting into small water droplets. Both evaporation and water droplet dispersion need to absorb heat.

As an example, the water atomization device 5 is a high-pressure pump atomizer. The high-pressure water generated by the high-pressure water pump is atomized at a nozzle. As another embodiment, the water atomization device 5 is an ultrasonic atomizer, which includes an ultrasonic atomization sheet, and the ultrasonic atomization sheet cooperates with ultrasonic waves to atomize water. As a third embodiment, the water atomization device 5 is an air compression atomizer, and the water vapor is sprayed into a spray chamber after the water from the nozzle mixes with air. The nozzle is connected with an air compressor through a connecting port of the air compressor and is connected with a water storage device through a water inlet. The water is atomized under the action of high-pressure gas generated by the air compressor. Specifically, a water softening device is mounted on a pipeline for supplying water to the water atomization device 5, so that scaling can be avoided after the water is softened. Further, the water atomization device 5 includes a water supply pipeline, which is in communication with a water tank or a water pipe and continuously supplies water to the closed shell. The water supply pipeline may be a single linear pipeline, or two or more pipelines arranged side by side, or a single pipeline arranged in a disc shape. Multiple water atomization devices 5 dispersed in the closed shell are provided.

Figure 5:
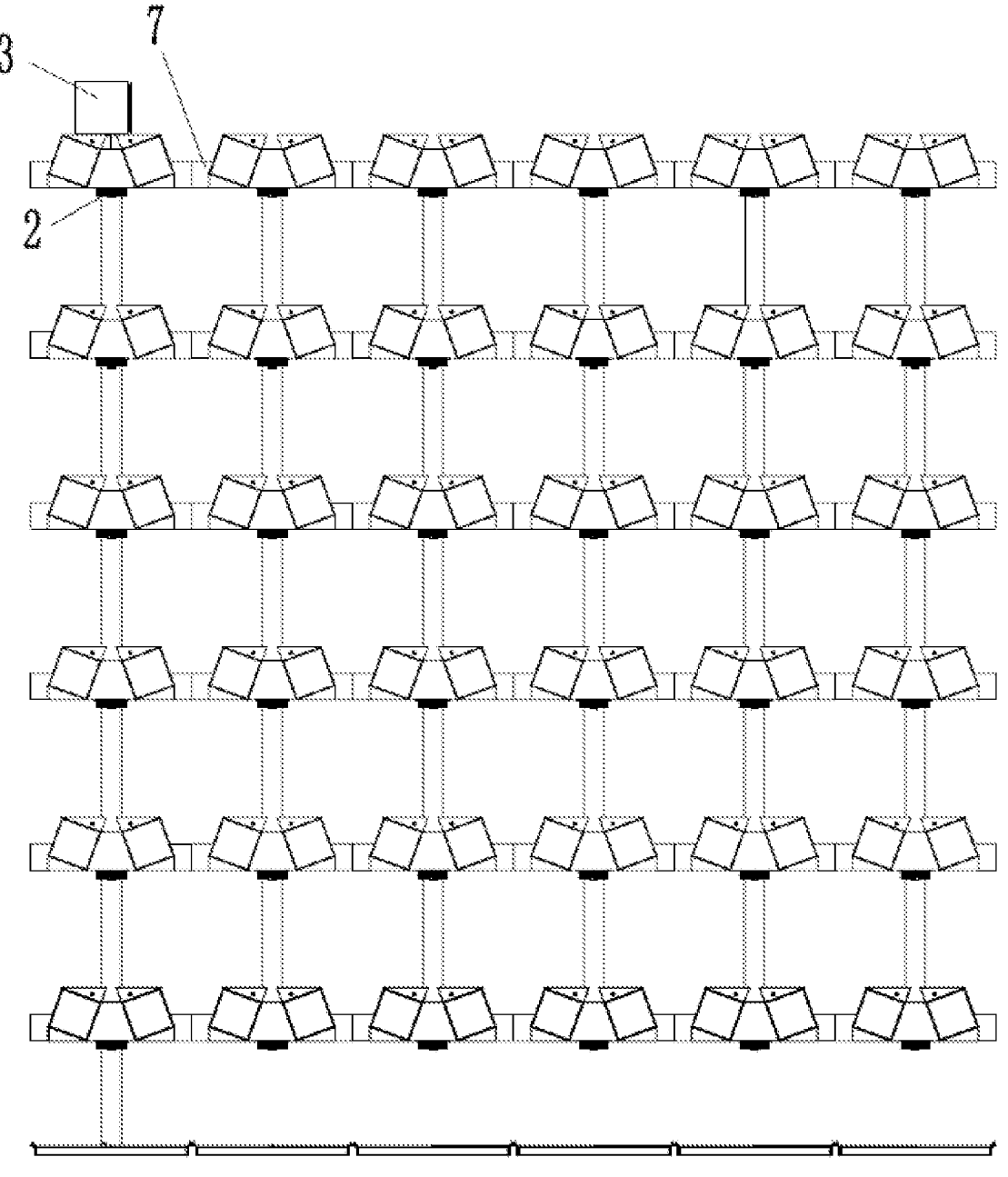
FIG. 5 is a schematic front view of a modular container-type data center according to an embodiment of the present application.
Figure 6:
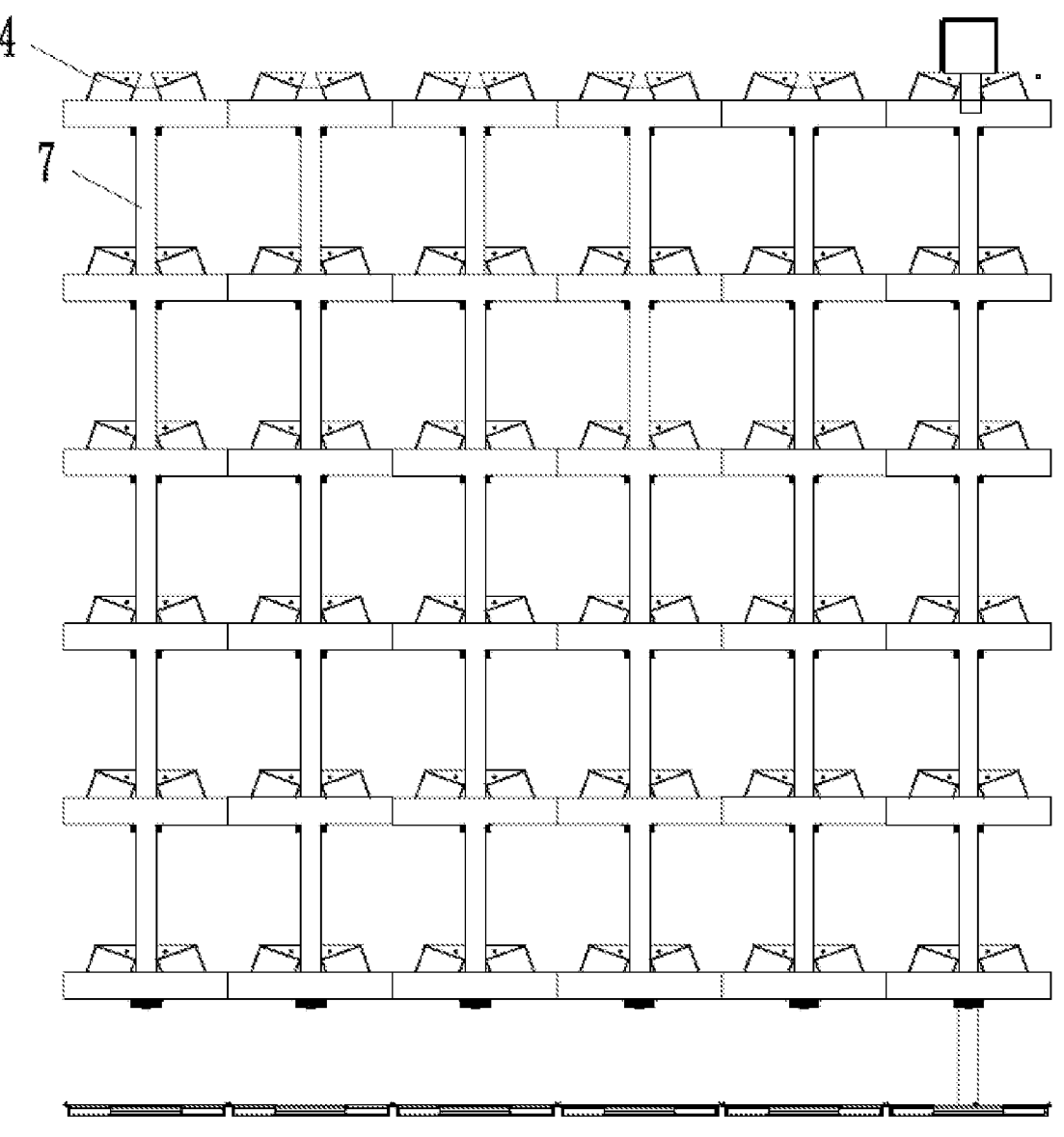
FIG. 6 is a schematic side view of the modular container-type data center according to the embodiment of the present application.

Referring to FIG. 5 and FIG. 6, a modular container-type data center in this embodiment includes modular containers and air conditioners. A space for placing a server is defined in each modular container, and the modular containers are connected through air ducts. Each air conditioner is the air conditioner using the water vapor refrigerant for the modular data center. The air ducts and the air conditioning system form a complete negative pressure evaporation refrigeration system. The data center according to the present application greatly improves space utilization, saves construction costs, improves construction speed, and achieves standardization and intensification of construction.

Figure 7:
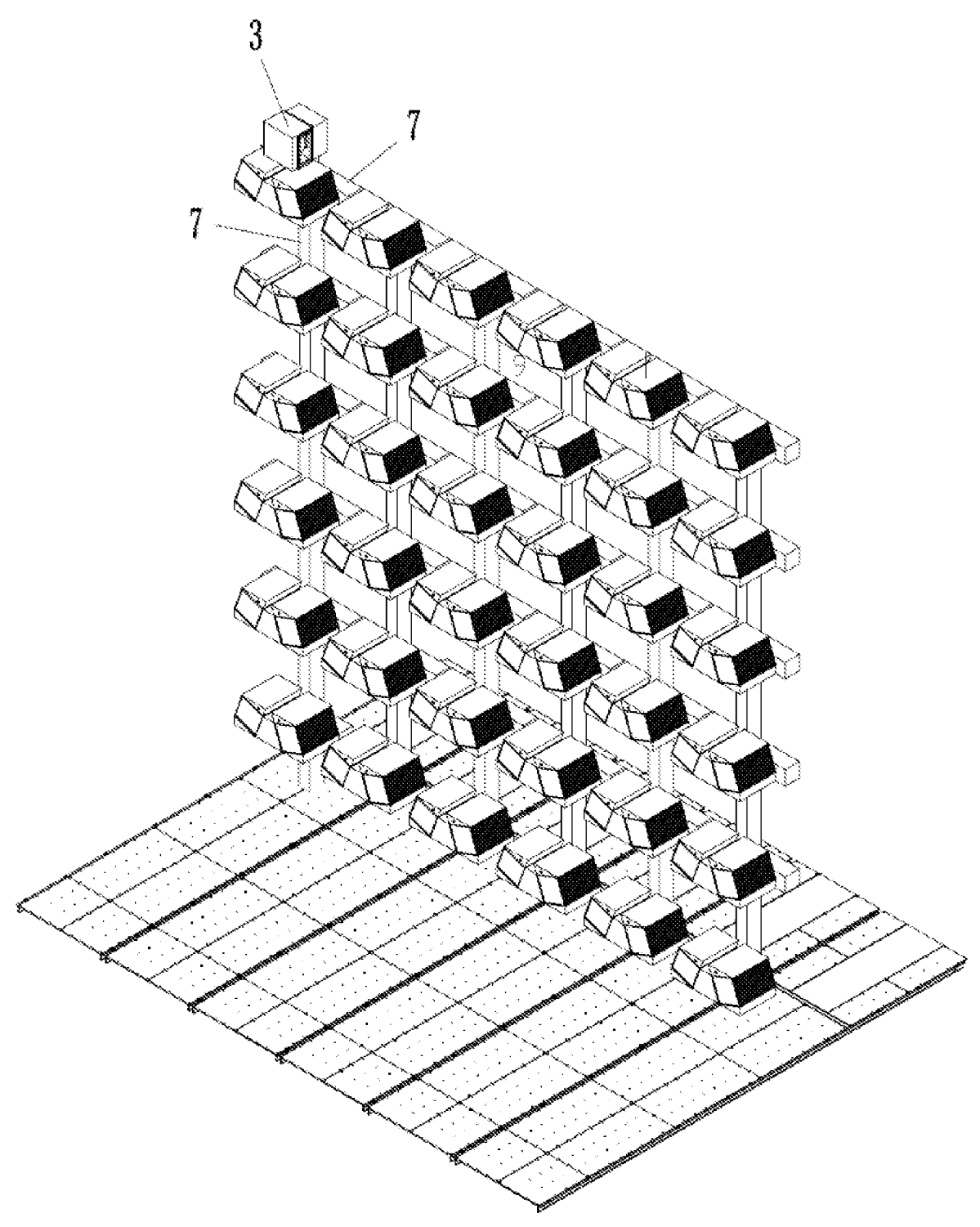
FIG. 7 is a partially schematic perspective view of the modular container-type data center according to the embodiment of the present application.

Referring to FIG. 1, FIG. 2, FIG. 5 and FIG. 6, the air conditioner includes a first heat exchanger and a second heat exchanger, the first heat exchanger and the second heat exchanger are fixed to the top of the modular container through a first water atomization device and a second water atomization device, the vapor mist side fan 3 arranged outside the box body 1 sucks out the vapor mist through the air ducts 7, and the air circulation side fan 2 arranged at the bottom of the heat exchanger 4 sucks the air in the modular container into the micro-channels of the heat exchanger 4 for heat exchange. Referring to FIG. 5 and FIG. 6, the data center includes n modular containers, and a heat exchanger 4 is provided in each container. The water atomization devices 5 inside the n modular containers are supplied with water through water supply pipelines, and a vapor mist discharge side of each heat exchanger 4 is connected to the vapor mist side fan 3 outside the box body 1 through the air duct 7. As shown in FIG. 7, the air ducts 7 include both horizontal air ducts and vertical air ducts, forming a series or parallel relationship. An insulation board is provided on each surface of the data center, which can avoid the interference of external heat sources and sundries, calculate a corresponding cooling capacity according to the heat generated by the server, and control the temperature accurately. A three-way pipe is arranged at an air outlet of the top fan for waste heat recovery. A temperature sensor is arranged in each modular container, so as to detect a temperature in the container and control the cooling capacity.

Preferably, the data center includes a liquid-jet carbon dioxide gas fire-fighting system. The liquid-jet carbon dioxide gas fire-fighting system includes a liquid reservoir storing liquid carbon dioxide and a liquid carbon dioxide fire-fighting pipeline (not shown), and the liquid carbon dioxide fire-fighting pipeline is connected to each modular container. The liquid carbon dioxide reservoir can be arranged below the frozen soil layer. The liquid carbon dioxide is used to extinguish fires and will not cause secondary damage to an object, which has a natural advantage. For a storage tank with the same volume, the amount of liquid storage is much greater than the amount of gaseous storage, and a fire extinguishing area is larger.

The air conditioner using the water vapor refrigerant according to the present application has simple structure, low energy consumption, low cost and high refrigeration efficiency, and can prevent outdoor temperature and humidity from affecting indoor environment. Water is used as the refrigerant according to the present application, and the water is atomized and mixed with air to form the vapor mist, which can be evaporated and cooled under the micro negative pressure. The refrigeration device does not require a compressor to drive the refrigerant to circulate (vapor compression cycle refrigeration), and a PUE (Power Usage Effectiveness) value of the data center is as low as 1.05. Therefore, the complexity of the device is greatly reduced, and the manufacturing cost and operating cost are reduced.

Finally, it should be noted that, the above embodiments are only used for illustration of the technical solutions of the present application rather than limitation to the protection scope of the present application. Although the present application has been illustrated in detail with reference to the preferred embodiments, it should be understood by those skilled in the art that, modifications or equivalent replacements may be made to the technical solutions of the present application without departing from the essence and scope of the present application.

The invention claimed is:

1. An air conditioner using a water vapor refrigerant for a modular data center, the air conditioner comprising:
a box body, and
an air conditioning system,
wherein the air conditioning system comprises:
a heat exchanger,
a water atomization device,
an air circulation side fan, and
a vapor mist side fan,
the heat exchanger has a plurality of columns of double-sided bidirectional micro-channels along an A-B direction and along a C-D direction, the vapor mist side fan is arranged outside the box body, the water atomization device is arranged on one side of the heat exchanger, the water atomization device comprises a pressure regulating device which cooperates with the water atomization device to form vapor mist, the vapor mist side fan is configured to form a negative pressure, so that the vapor mist evaporates under the negative pressure in the heat exchanger along the C-D direction to absorb heat and refrigerate; the air circulation side fan is configured to suck air in a space to be cooled into the micro-channels of the heat exchanger, and air is discharged into the space to be cooled after heat exchange is completed in the micro-channels.

2. The air conditioner using the water vapor refrigerant for the modular data center according to claim 1, wherein the heat exchanger is a surface-type heat exchanger or a shell-and-tube heat exchanger.

3. A modular container data center, comprising:
modular containers, and
air conditioners,
wherein a space for placing a server is defined in each modular container, and the modular containers are connected through air ducts, wherein each air conditioner is the air conditioner using the water vapor refrigerant for the modular data center according to claim 2.

4. The air conditioner using the water vapor refrigerant for the modular data center according to claim 1, wherein the pressure regulating device is an electric air valve and a negative pressure sensor.

5. A modular container data center, comprising:
modular containers, and
air conditioners,
wherein a space for placing a server is defined in each modular container, and the modular containers are connected through air ducts, wherein each air conditioner is the air conditioner using the water vapor refrigerant for the modular data center according to claim 4.

6. The air conditioner using the water vapor refrigerant for the modular data center according to claim 1, wherein the water atomization device is a high-pressure pump atomizer;
or the water atomization device is an air compression atomizer;
or the water atomization device is an ultrasonic atomizer.

7. A modular container data center, comprising:
modular containers, and
air conditioners,
wherein a space for placing a server is defined in each modular container, and the modular containers are connected through air ducts, wherein each air conditioner is the air conditioner using the water vapor refrigerant for the modular data center according to claim 6.

8. The air conditioner using the water vapor refrigerant for the modular data center according to claim 1, wherein a water softener is mounted on a pipeline for supplying water to the water atomization device.

9. A modular container data center, comprising:
modular containers, and
air conditioners,
wherein a space for placing a server is defined in each modular container, and the modular containers are connected through air ducts, wherein each air conditioner is the air conditioner using the water vapor refrigerant for the modular data center according to claim 8.

10. A modular container data center, comprising:
modular containers, and
air conditioners,
wherein a space for placing a server is defined in each modular container, and the modular containers are connected through air ducts, wherein each air conditioner is the air conditioner using the water vapor refrigerant for the modular data center according to claim 1.

11. The modular container data center according to claim 10, wherein the air conditioner comprises;
a first heat exchanger, and
a second heat exchanger,
the first heat exchanger and the second heat exchanger are fixed to the top of the modular container through a first water atomization device and a second water atomization device, the vapor mist side fan arranged outside the box body sucks out the vapor mist through the air ducts, and the air circulation side fan arranged at the bottom of the first heat exchanger and the second heat exchanger sucks the air in the modular container into the micro-channels of the first heat exchanger and the second heat exchanger for heat exchange.

12. The modular container data center according to claim 10, wherein the data center comprises n modular containers, a plurality of water atomization devices in the n modular containers are supplied with water through water supply pipelines, and a vapor mist discharge side of each heat exchanger is connected with the vapor mist side fan outside the box body through the air duct.

* * * * *